(12) United States Patent
Tsai

(10) Patent No.: US 8,372,696 B2
(45) Date of Patent: Feb. 12, 2013

(54) REPAIR METHOD AND ACTIVE DEVICE ARRAY SUBSTRATE

(75) Inventor: Tung-Chang Tsai, Miaoli County (TW)

(73) Assignee: Au Optronics Corporation, Hsinchu (TW)

( * ) Notice: Subject to any disclaimer, the term of this patent is extended or adjusted under 35 U.S.C. 154(b) by 319 days.

(21) Appl. No.: 12/785,497

(22) Filed: May 24, 2010

(65) Prior Publication Data

US 2011/0227077 A1 Sep. 22, 2011

(30) Foreign Application Priority Data

Mar. 17, 2010 (TW) .............................. 99107838 A

(51) Int. Cl.
*H01L 21/82* (2006.01)
(52) U.S. Cl. .............................. 438/128; 438/4; 438/130
(58) Field of Classification Search .................. 438/128, 438/4, 130
See application file for complete search history.

(56) References Cited

U.S. PATENT DOCUMENTS

| 7,265,386 | B2 | 9/2007 | Chen et al. | |
|---|---|---|---|---|
| 7,612,861 | B2 | 11/2009 | Kwon et al. | |
| 2010/0265424 | A1* | 10/2010 | Chiu et al. | 349/54 |

FOREIGN PATENT DOCUMENTS

| CN | 101424840 A | 5/2009 |
|---|---|---|
| CN | 101581856 | 11/2009 |
| TW | I260693 | 8/2006 |
| TW | I302211 | 10/2008 |

OTHER PUBLICATIONS

"Second Office Action of China Counterpart Application", issued on Aug. 31, 2011, p. 1-p. 6, in which the listed reference was cited.
"1st Office Action of China Counterpart Application", issued on Feb. 1, 2011, p. 1-p. 5, in which the listed reference was cited.

* cited by examiner

*Primary Examiner* — Douglas Menz
(74) *Attorney, Agent, or Firm* — Jianq Chyun IP Office

(57) ABSTRACT

A repair method for repairing an active device array substrate is provided. The active device array substrate includes a substrate, scan lines, data lines, active devices, pixel electrodes, and common lines. At least one of the scan line has an open defect. The scan lines and the data lines are intersected to define sub-pixel regions. The active devices are electrically connected with the scan lines and the data lines correspondingly. Each pixel electrode is disposed in one of the sub-pixel regions and electrically connected with one of the active devices. The repair method includes cutting one of the common lines neighboring to the open defect to form a cutting block that is electrically insulated from the common lines; and welding the cutting block, the scan line having the open defect and two active devices located at two opposite sides of the open defect.

4 Claims, 2 Drawing Sheets

REPAIR METHOD AND ACTIVE DEVICE ARRAY SUBSTRATE

CROSS-REFERENCE TO RELATED APPLICATION

This application claims the priority benefit of Taiwan application serial no. 99107838, filed on Mar. 17, 2010. The entirety the above-mentioned patent application is hereby incorporated by reference herein and made a part of specification.

BACKGROUND OF THE INVENTION

1. Field of the Invention

The invention relates to an active device array substrate. More particularly, the invention relates to a repair method of an active device array substrate.

2. Description of Related Art

The rapid development of a multimedia society mostly results from the fact that semiconductor components or human-machine display apparatuses have progressed by leaps and bounds. As for the display, the cathode ray tube (CRT) is the mainstream in the display market in the recent years due to its excellent displaying quality and cost-effectiveness. However, judging from the working environment where people operate most desktop terminal machines/display devices, or the energy-saving trend informed by environmentalism, the CRT still creates many problems for its occupation of large space and high power consumption. The CRT cannot effectively meet the demands on features such as lightness, thinness, compactness and low power consumption. Thus, thin film transistor liquid crystal display (TFT-LCD) panels have gradually become the mainstream display products in the market because of its high picture quality, high spatial utilization, low power consumption and radiation free operation. Among TFT-LCD panels, TFT-LCD panels with high definition attract more attention. In TFT-LCD panels with high definition, the increase in the number of scan lines has become a trend. However, due to the consideration of aperture ratio of the panels, the rescue lines design for repairing scan lines with open defect is not available in the conventional TFT-LCD panels with high definition. Consequently, when open defects occur on scan lines, the panel is usually considered as defective, thereby raising manufacturing cost.

SUMMARY OF THE INVENTION

The invention is directed to a repair method of an active device array substrate and a repaired active device array substrate.

The invention is directed to a repair method for repairing an active device array substrate. The active device array substrate includes a substrate, a plurality of scan lines, a plurality of data lines, a plurality of active devices, a plurality of pixel electrodes, and a plurality of common lines. At least one of the scan lines has an open defect. The scan lines and the data lines are intersected to define a plurality of sub-pixel regions on the substrate. Each of the active devices is electrically connected to one of the scan lines and one of the data lines correspondingly. Each of the pixel electrodes is disposed in one of the sub-pixel regions and electrically connected to one of the active devices. The repair method includes: cutting one of the common lines neighboring to the open defect to form a cutting block that is electrically insulated from the common lines; and welding the cutting block, the scan line having the open defect, and two active devices located at two opposite sides of the open defect, such that the cutting block is electrically connected to the scan line having the open defect.

According to an embodiment of the invention, each active device has a gate, a source, and a drain. The source is electrically connected to one of the data lines. The drain is electrically connected to one of the pixel electrodes. Moreover, the method of welding the cutting block, the scan line having the open defect, and the two active devices located at the two opposite sides of the open defect includes: welding the cutting block, the scan line having the open defect, and the two drains of the two active devices located at the two opposite sides of the open defect.

According to an embodiment of the invention, the method of welding the cutting block, the scan line having the open defect, and the two active devices located at the two opposite sides of the open defect includes laser welding.

According to an embodiment of the invention, the method of cutting one of the common lines neighboring to the open defect includes laser cutting.

The invention is directed to an active device array substrate including a substrate, a plurality of scan lines, a plurality of data lines, a plurality of active devices, a plurality of pixel electrodes, and a plurality of common lines. The scan lines are disposed on the substrate, where at least one of the scan lines has an open defect. The data lines are disposed on the substrate, and the scan lines and the data lines are intersected to define a plurality of sub-pixel regions on the substrate. The active devices are disposed on the substrate, and each of the active devices is electrically connected to one of the scan lines and one of the data lines. The pixel electrodes are disposed on the substrate. Each of the pixel electrodes is disposed in one of the sub-pixel regions and electrically connected to one of the active devices. The common lines are disposed on the substrate, and at least one of the common lines has a cutting block neighboring to the open defect. The cutting block, the scan line having the open defect, and two active devices located at two opposite sides of the open defect are welded, such that the cutting block is electrically connected to the scan line having the open defect.

According to an embodiment of the invention, each of the active devices has a gate, a source, and a drain. The source is electrically connected to one of the data lines and the drain is electrically connected to one of the pixel electrodes.

According to an embodiment of the invention, the cutting block, the scan line having the open defect, and the two drains of the two active devices located at the two opposite sides of the open defect are welded.

According to an embodiment of the invention, the two drains of the two active devices located at the two opposite sides of the open defect are overlapped with the cutting block.

According to an embodiment of the invention, each drain is overlapped with the common lines.

According to an embodiment of the invention, the common lines are disposed under the pixel electrodes.

In light of the foregoing, since a portion of the common lines are cut to be served as a repair line in the invention, the repair method herein is capable of repairing the active device array substrate without significantly affecting the aperture ratio.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
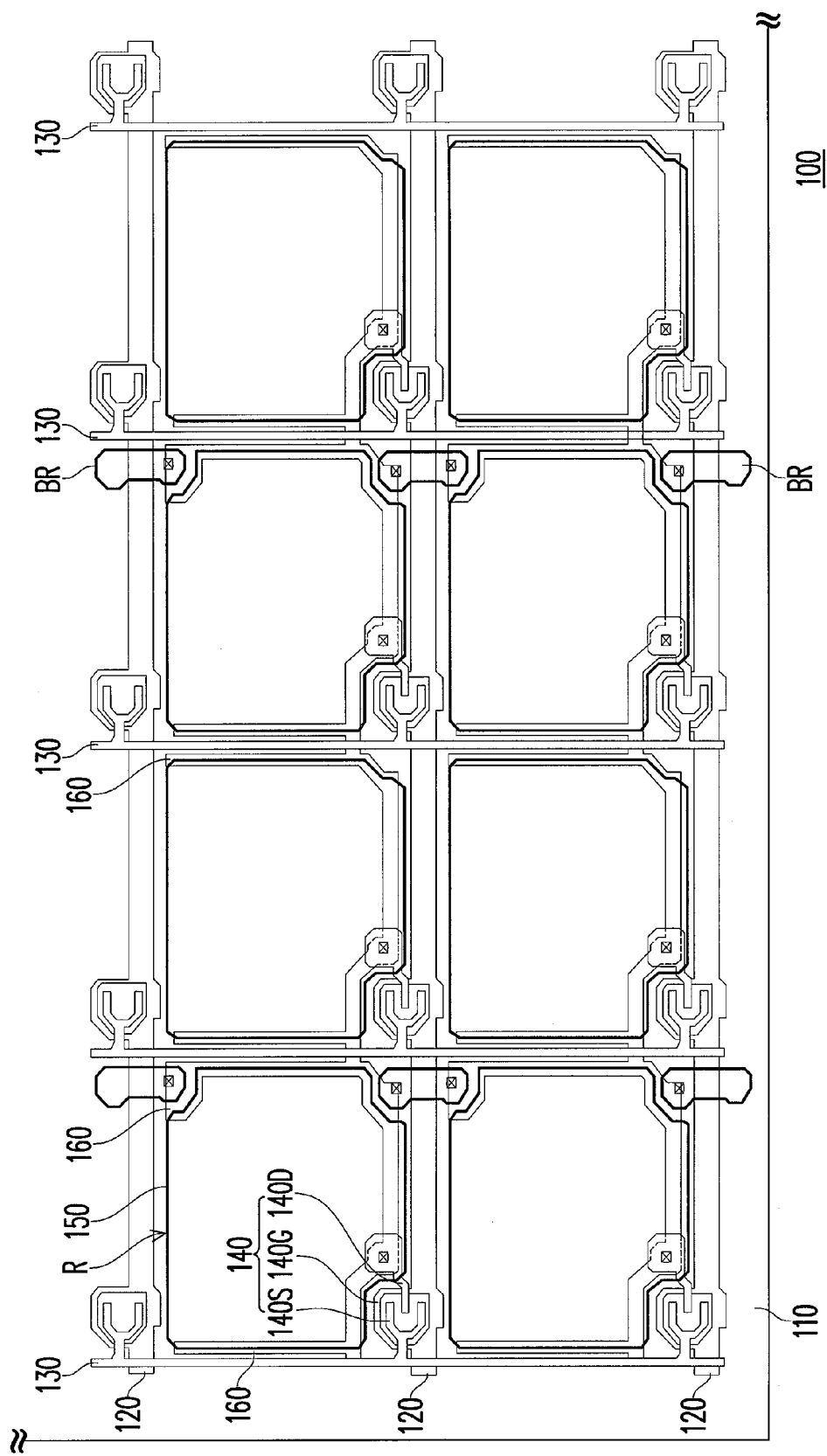
FIG. 1 is a schematic view of an active device array substrate according to an embodiment of the invention.
Figure 2:
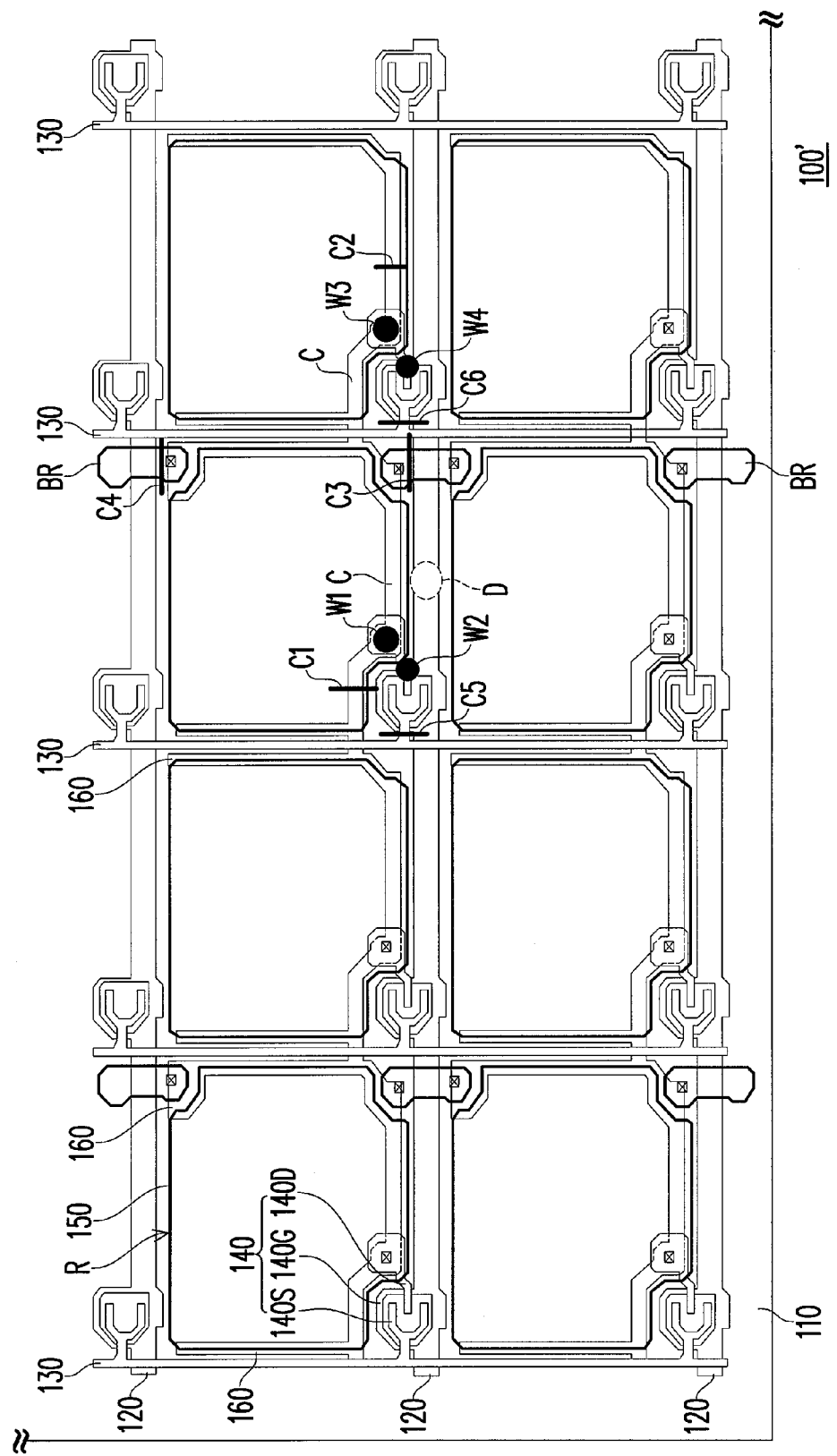
FIG. 2 is a schematic view illustrating the active device array substrate depicted in FIG. 1 after repairing.

FIG. 1 is a schematic view of an active device array substrate according to an embodiment of the invention. FIG. 2 is a schematic view illustrating the active device array substrate in FIG. 1 after repairing. Referring to FIGS. 1 and 2, a repair method of the present embodiment is suitable for repairing an active device array substrate 100 shown in FIG. 1 so as to increase the production yield of the active device array substrate 100. As shown in FIG. 1, the active device array substrate 100 includes a substrate 110, a plurality of scan lines 120, a plurality of data lines 130, a plurality of active devices 140, a plurality of pixel electrodes 150, and a plurality of common lines 160. The scan lines 120 and the data lines 130 are intersected to define a plurality of sub-pixel regions R on the substrate 110. Each active device 140 is electrically connected to one of the scan lines 120 and one of the data lines 130 correspondingly. Each of the pixel electrodes 150 is disposed in one of the sub-pixel regions R and electrically connected to one of the active devices 140. Moreover, the common lines 160 of the present embodiment are disposed under the pixel electrodes 150, for example, so as to be coupled with the pixel electrodes 150 to form a storage capacitor.

In the present embodiment, each active device 140 has a gate 140G, a source 140S, and a drain 140D. The source 140S is electrically connected to one of the data lines 130 and the drain 140D is electrically connected to one of the pixel electrodes 150.

As illustrated in FIGS. 1 and 2, the active device array substrate 100 of the present embodiment does not require additional repair lines or rescue lines, such that the active device array substrate 100 of the present embodiment has high aperture ratio.

When the scan line 120 has an open defect D due to improper production handling or other factors, the yield rate of panels can be enhanced effectively without affecting the aperture ratio through the repair method of the present embodiment, such that the production cost can be further reduced. With reference to FIG. 2, a detailed description is provided hereinafter for a repair method of an active device array substrate 100'.

Referring to FIG. 2, when one or multiple scan lines 120 have the open defect D resulted from improper production handling or other factors, one of the common lines 160 neighboring to the open defect D is adopted as the repair line in the present embodiment, so that the one or multiple scan lines 120 having the open defect D can be repaired and function normally. For example, in the present embodiment, the common line 160 neighboring to the open defect D is cut first in the present embodiment so as to form a cutting block C that is electrically insulated from the common line 160. Thereafter, the cutting block C is electrically connected to the two active devices 140 located at two opposite sides of the open defect D through welding. Moreover, the scan line 120 having the open defect D is electrically connected to the two active devices 140 located at the two opposite sides of the open defect D through welding. After the welding aforementioned, the cutting block C is electrically connected to the scan line 120 having the open defect D. It is noted that the welding process can be performed prior to the cutting process in other embodiments of the invention, and the same repairing performance can be achieved.

As illustrated in FIG. 2, in order to form the cutting block C which is electrically insulated from the common lines 160, a laser cutting process is carried out along cutting lines C1, C2, C3, and C4, so that the cutting block C is separated from the common lines 160. In details, the laser cutting process performed along the cutting lines C1, C2 is adopted mainly for cutting the common lines 160. Moreover, since the common lines 160 may be electrically connected to one another through a plurality of bridge conductors BR, the laser cutting process proceeded along the cutting lines C3, C4 are thus performed for cutting a portion of the bridge conductors BR. After the laser cutting process has been performed along the cutting lines C1, C2, C3, C4, the cutting block C is then used as the repair line. In the present embodiment, the cutting block C and the drain 140D are welded at welding points W1 and W3, and the drain 140D and the scan line 120 are welded at welding points W2 and W4, such that the signals transmitted by the scan line 120 are not affected by the open defect D. Accordingly, the signals can be transmitted through the cutting block C and the scan line 120 having the open defect D jointly. For example, the foregoing welding is accomplished through laser welding.

It should be noted that in other exemplary embodiments, the common lines 160 extended in a row-wise manner can be electrically connected directly in the peripheral region and the bridge conductors BR are not required. At this time, the laser cutting performed along the cutting lines C3, C4 can be omitted.

However, as the cutting block C is electrically connected to the scan line 120 having the open defect D through the drains 140D of the two active devices 140, the laser cutting process needs to be proceeded along cutting lines C5, C6 for the two active devices 140 (that is, the source 140S) located at the two opposite sides of the open defect, so as to be electrically insulated from the corresponding data lines 130. Consequently, the signals transmitted through the data lines 130 are not transmitted to the scan line 120 having the open defect D.

Referring to FIG. 2, the active device array substrate 100' which is repaired by the foregoing repair method includes a substrate 110, a plurality of scan lines 120, a plurality of data lines 130, a plurality of active devices 140, a plurality of pixel electrodes 150, and a plurality of common lines 160. The scan lines 120 are disposed on the substrate 110, where at least one of the scan lines 120 has an open defect D. The data lines 130 are disposed on the substrate 110, and the scan lines 120 and the data lines 130 are intersected to define a plurality of sub-pixel regions R on the substrate 110. The active devices 140 are disposed on the substrate 110, and each of the active devices 140 is electrically connected to one of the scan lines 120 and one of the data lines 130 respectively. The pixel electrodes 150 are disposed on the substrate 110. Each of the pixel electrodes 150 is disposed in one of the sub-pixel regions R and electrically connected to one of the active devices 140. The common lines 160 are disposed on the substrate 110, and at least one of the common lines 160 has a cutting block C neighboring to the open defect D. The cutting block C, the scan line 120 having the open defect D, and the two active devices 140 located at two opposite sides of the open defect D are welded, such that the cutting block C is electrically connected to the scan line 120 having the open defect D. In details, the cutting block C and the drain 140D are welded at welding points W1 and W3, and the drain 140D and the scan line 120 are welded at welding points W2 and W4.

It is depicted in FIG. 2 that each drain 140D is overlapped with the common lines 160 to facilitate the welding process (at the welding points W1 and W3). Obviously, the invention is not limited to the overlap of the drains 140D and the common lines 160. In other words, the drains 140D can be electrically connected to the common lines 160 through other methods such as laser chemical vapor deposition process (laser CVD).

In summary, since a portion of the common lines are cut to be adopted as repair lines in the invention, the repair method herein is capable of repairing the active device array substrate without significantly affecting the aperture ratio.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A repair method for repairing an active device array substrate comprising a substrate, a plurality of scan lines, a plurality of data lines, a plurality of active devices, a plurality of pixel electrodes, and a plurality of common lines, wherein at least one of the scan lines has an open defect, the scan lines and the data lines are intersected to define a plurality of sub-pixel regions on the substrate, each of the active devices is electrically connected to one of the scan lines and one of the data lines correspondingly, each of the active devices comprises a gate connected to the corresponding scan line, a source connected to the corresponding data line, and a drain connected to the corresponding pixel electrode, each of the pixel electrodes is disposed in one of the sub-pixel regions, and the repair method comprising:

cutting one of the common lines neighboring to the open defect to form a cutting block electrically insulated from the common lines; and welding the cutting block, the scan line having the open defect, and two of the active devices located at two opposite sides of the open defect, wherein the drains of the two of the active devices are overlapped with the cutting block, the drains of the two of the active devices and the cutting block are welded at the positions where the drains are located, such that the cutting block is electrically connected to the scan line having the open defect.

2. The repair method as claimed in claim 1, wherein a method of welding the cutting block, the scan line having the open defect, and the two active devices located at two opposite sides of the open defect comprises:

welding the cutting block, the scan line having the open defect, and the two drains of the two active devices located at the two opposite sides of the open defect.

3. The repair method as claimed in claim 1, wherein a method of welding the cutting block, the scan line having the open defect, and the two active devices located at the two opposite sides of the open defect comprises laser welding.

4. The repair method as claimed in claim 1, wherein a method of cutting one of the common lines neighboring to the open defect comprises laser cutting.

* * * * *